(12) United States Patent
Kuan et al.

(10) Patent No.: US 7,803,229 B2
(45) Date of Patent: Sep. 28, 2010

(54) APPARATUS AND METHOD FOR COMPENSATING UNIFORMITY OF FILM THICKNESS

(75) Inventors: Da-Shuang Kuan, Hsinchu County (TW); Chun-Sheng Fan, Hsinchu County (TW); Chia-Te Lin, Chiayi County (TW)

(73) Assignee: Himax Display, Inc., Tainan County (TW)

( * ) Notice: Subject to any disclaimer, the term of this patent is extended or adjusted under 35 U.S.C. 154(b) by 515 days.

(21) Appl. No.: 11/675,401

(22) Filed: Feb. 15, 2007

(65) Prior Publication Data

US 2008/0199609 A1    Aug. 21, 2008

(51) Int. Cl.
*C23C 16/00*    (2006.01)
*C23F 1/00*     (2006.01)
*H01L 21/306*   (2006.01)

(52) U.S. Cl. ............... 118/720; 156/345.19; 156/345.3
(58) Field of Classification Search ................. 118/720, 118/721; 216/12; 250/559.3; 355/53, 75; 378/35; 427/468; 430/5
See application file for complete search history.

(56) References Cited

U.S. PATENT DOCUMENTS

| 3,773,541 | A  | * | 11/1973 | Ng et al. ..................... 427/10 |
| 5,268,781 | A  |   | 12/1993 | Shigeta et al. |
| 5,624,536 | A  | * | 4/1997  | Wada et al. ............. 204/298.11 |
| 6,426,786 | B1 |   | 7/2002  | Lu et al. |
| 6,771,341 | B2 |   | 8/2004  | Ohkouchi et al. |
| 2002/0044860 | A1 | * | 4/2002  | Hayashi et al. ........ 414/416.03 |
| 2003/0155234 | A1 | * | 8/2003  | Feltsman et al. ....... 204/298.11 |
| 2005/0081997 | A1 | * | 4/2005  | Yoshioka et al. ......... 156/345.3 |

* cited by examiner

*Primary Examiner*—Parviz Hassanzadeh
*Assistant Examiner*—Tiffany Nuckols
(74) *Attorney, Agent, or Firm*—J.C. Patents

(57) ABSTRACT

An apparatus and a method for compensating uniformity of film thickness are provided. A shielding plate is provided between a vapor deposition object and a evaporation source. During the vapor deposition process, a shielding plate is continuously moved according to film deposition rates, so as to selectively pass or block atoms emitted from the evaporation source to achieve purpose of adjustably depositing.

8 Claims, 7 Drawing Sheets

APPARATUS AND METHOD FOR COMPENSATING UNIFORMITY OF FILM THICKNESS

BACKGROUND OF THE INVENTION

1. Field of the Invention

The present invention relates to an apparatus for depositing film with a uniform thickness and a method thereof. More particularly, the present invention relates to an apparatus for uniforming the thickness of a vapor deposition film and a method thereof.

2. Description of Related Art

Angle vapor deposition is one of vapor deposition methods, and the vapor deposition object is placed at a tilt angle with respect to the evaporation source. For example, U.S. Pat. No. 5,268,781 issued to JVC, U.S. Pat. No. 6,426,786 issued to IBM, and U.S. Pat. No. 6,771,341, etc. FIG. 1 is a schematic diagram illustrating a conventional angle vapor deposition. Atoms emitted from the evaporation source 10 are deposited on a substrate 20 placed over the evaporation source 10 to form a thin film thereon. The normal line N of the substrate 20 is tilted by an angle $\theta$ with respect to an atom emission direction of the evaporation source. Referring to FIG. 1, since the substrate 20 is disposed at a tilt angle $\theta$, one side of the substrate is away from the evaporation source while another side thereof is closer to the evaporation source. Accordingly, differences in the deposited film thickness will occur due to different deposition positions on the substrate 20 within a specified period. To resolve the foregoing non-uniformity issue of the film thickness, methods are provided that atoms emitted from the evaporation source can be evenly deposited on the substrate by using the revolution or rotation of the vapor deposition objected.

The angle vapor deposition process may also be applied to the fabrication of liquid crystal display panels, whose structure intrinsically has an alignment film. Since the alignment film has to be aligned at the same direction, the vapor deposition object cannot be rotated while evaporating alignment film. Rotating the vapor deposition object may result in the aforementioned adverse effect for the uniformity of film thickness. The thickness variation of the alignment film may cause instability in the optical and electrical characteristics of products. Thus, it is very difficult to fabricate a thin film having a large area and a uniform thickness by using the angle vapor deposition process.

Moreover, different material used as the target in the vapor deposition has different emission characteristics, and different emission characteristics may cause different distribution of film thickness. Therefore, it is a great challenge for controlling the thickness uniformity of each film.

SUMMARY OF THE INVENTION

To resolve the problems described above, the present invention provides a vapor deposition method for depositing film with uniform thickness and an apparatus thereof, wherein a movable shielding plate is provided between the evaporation source and the vapor deposition object, so as to make the film thickness uniform.

According to one embodiment of the present invention, a method for compensating uniformity of a film thickness is provided. The method comprises following steps. An evaporation source is provided, and a vapor deposition object is tilted at an angle with respect to the evaporation source. A shielding plate is provided between the evaporation source and the vapor deposition object. A vapor deposition process is thus performed. During the vapor deposition process, the shielding plate is moved continuously according to film deposition rates, so as to selectively pass or block atoms emitted from the evaporation source. The amount of atoms deposited on the surface of the vapor deposition object can be compensated according to the deposition rates through the movements of the shielding plate.

In the film deposition method described above, the movements of the shielding plate can be controlled by a program. In addition, the movements of the shielding plate can comprise: moving the shielding plate up and down in relative to the evaporation source and the vapor deposition object, so as to adjust a distance between the shielding plate and the evaporation source. The shielding plate can also be moved or rotated horizontally. Furthermore, the shielding plate can also be rotated vertically so as to adjust a tilt angle between the shielding plate and the evaporation source. Preferably, the tilt angle can be adjusted in a manner that the shielding plate is parallel to the surface of the vapor deposition object.

In the method described above, during the period when the shielding plate moves continuously, at least one suspension period can be further added for controlling the movements of the shielding plate based on the actual conditions. Moreover, the method can further comprise: providing an ion source for performing an ion bombard against the vapor deposition object during the vapor deposition process.

According to another embodiment of the present invention, an apparatus for compensating uniformity of a film thickness is provided. The apparatus comprises a shielding plate and a moving component. The shielding plate is disposed between an evaporation source and a vapor deposition object, and the moving component is coupled to the shielding plate. The moving component moves the shielding plate according to film deposition rates during the vapor deposition process, so as to selectively pass or block atoms emitted from the evaporation source, so that the deposition rates are adjusted to achieve an effect of obtaining a uniform film.

In the above apparatus, the moving component, for example, can further comprises at least an extension transmission rod coupled to the shielding plate for moving the shielding plate, and an erecting shaft coupled to the extension transmission rod through a pivot component. The erecting shaft is capable of performing a rotation movement or an up-and-down lifting movement for the shielding plate. The rotation movement can comprises: rotating the shielding plate horizontally around to the erecting shaft, so as to cover the evaporation source intermittently. In addition, the rotation movement can also be to rotate the shielding plate vertically relative to the erecting shaft, so as to adjust a tilt angle between the shielding plate and the vapor deposition object. In addition, the foregoing up-and-down movement of the shielding plate is performed in relative to the evaporation source and the vapor deposition object, so as to adjust a distance between the shielding plate and the evaporation source. The moving component can control the shielding plate to temporally stop in at least one suspension period during the vapor deposition process.

According to embodiments of the present invention, the shielding plate is a solid plate, for example. The solid plate can be further designed to have a specific curve formed according to a distance between the vapor deposition object and the evaporation source. Furthermore, the shielding plate may be, for example, a hollow solid plate having a hollow pattern or a hollow mesh plate having a mesh pattern. The density distribution of the hollow pattern or the mesh pattern can be designed according to the distance between the vapor deposition object and the evaporation source.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

According to an aspect of the present invention, a movable shielding plate is disposed between the evaporation source and the vapor deposition object, and the position distribution and deposition amount of atoms fallen onto the surface of the vapor deposition object are compensated through dynamic movements of the shielding plate during the vapor deposition process, so as to form a uniform vapor deposition film. The compensation function of the shielding plate is achieved by moving the shielding plate or by the shape of the shielding plate itself, which will be described below with reference to embodiments of the present invention.

The First Embodiment

Figure 2:
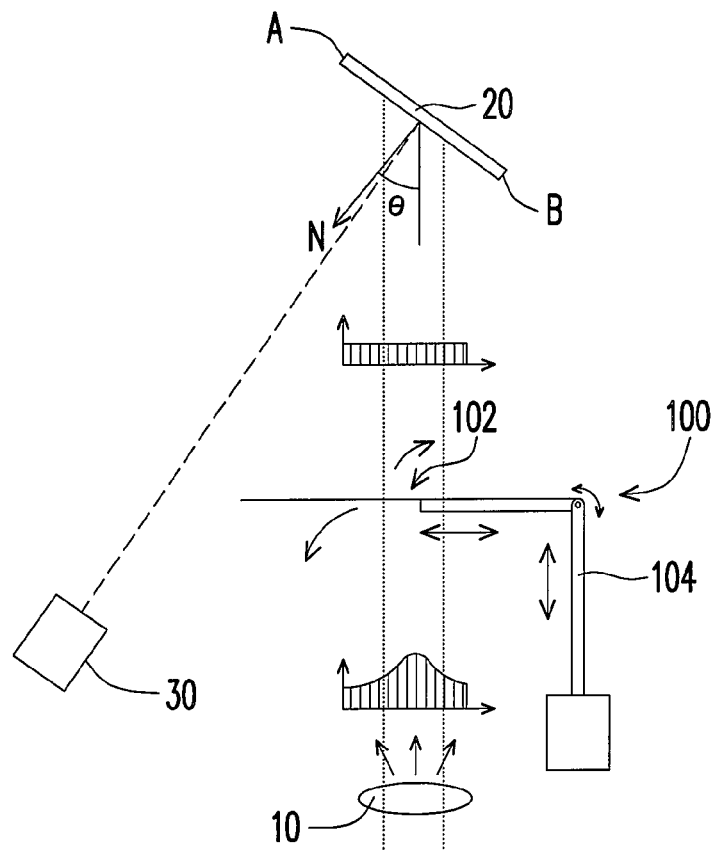
FIG. 2 is a conception diagram showing an apparatus for compensating a uniformity of a film thickness according to the present invention.
Figure 3A:
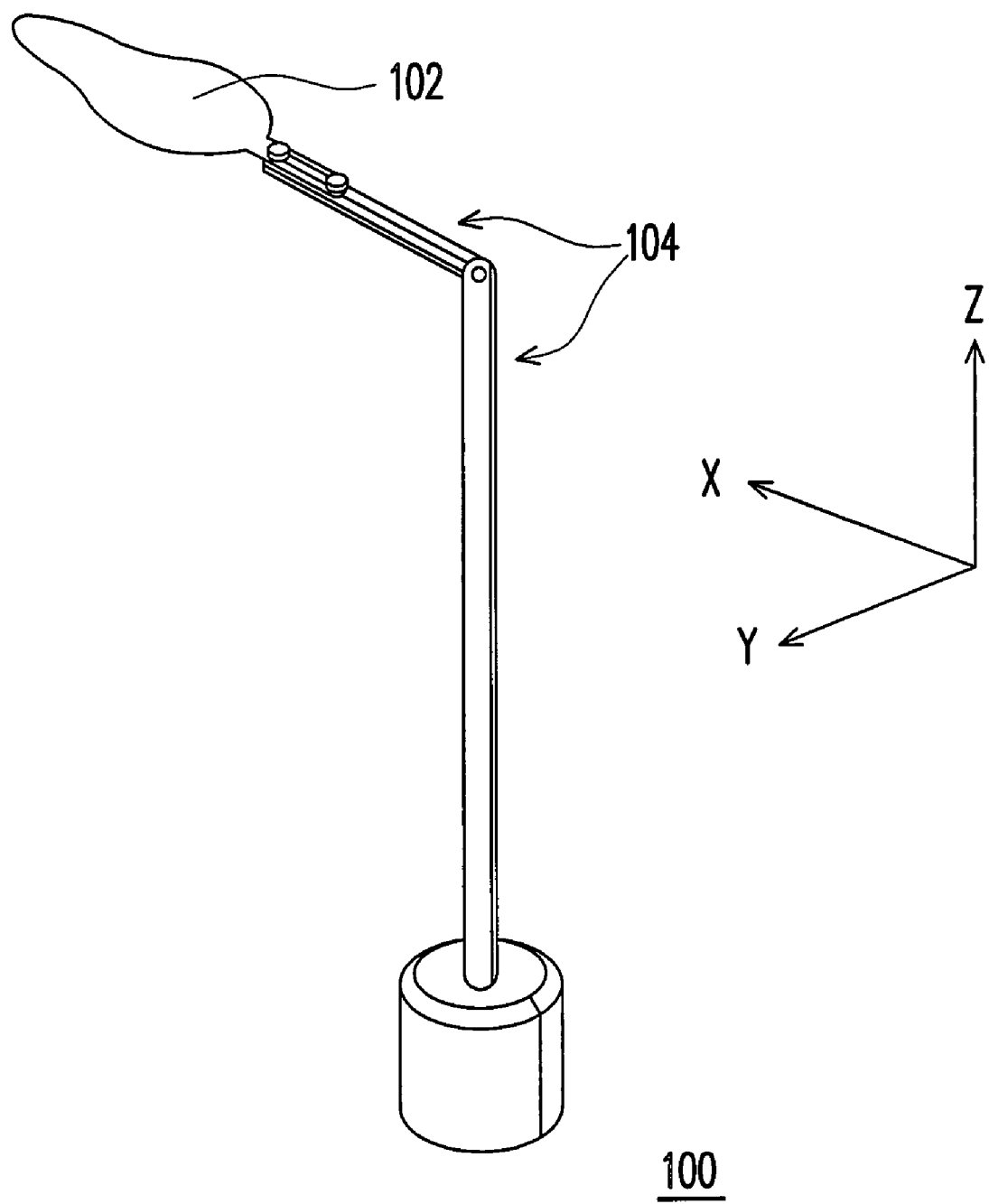
FIG. 3A is a perspective view of an apparatus for compensating a uniformity of a film thickness.

FIG. 2 is a conception diagram of an apparatus for compensating uniformity of film thickness according to the present invention. FIG. 3A is a perspective view of the apparatus for compensating uniformity of film thickness. Referring to FIG. 2, the film thickness uniformity compensating apparatus 100 comprises at least a shielding plate 102 and a moving component 104. The moving component 104 is coupled to the shielding plate 102 and is used for controlling movements of the shielding plate 102.

Basically, the shielding plate 102 can be a flat plate or a mesh plate disposed between the evaporation source 10 and the vapor deposition object (a substrate is used as an example hereinafter) 20. The shielding plate 102 is disposed in a manner capable of blocking atoms emitted from the evaporation source 10. Furthermore, the atoms can be further passed through or blocked by the shielding plate 102 through the shape of the shielding plate 102, which will be described in detail below. The curve in lower part of FIG. 2 roughly shows a non-uniform distribution of film thickness without passing through the shielding plate 102, while the curve in upper part of FIG. 2 shows a uniform distribution of film thickness after passing through the shielding plate 102.

The moving component 104 is used to move the shielding plate 102 to compensate the film thickness deposited on the substrate 20, so that the uniformity of the film thickness can meet the requirements. In the present embodiment, the moving component 104 can provide movements of various degrees of freedom. For example, as shown in FIG. 3A, in the present embodiment, the movements of the shielding plate can comprise at least moving transversely along the X-axis (defined as a horizontal movement), rotating around the Z-axis (on the XY plane, defined here as a horizontal rotation), lifting upwards or downwards along the Z-axis, and rotating around the Y-axis (on the XZ plane, defined here as a vertical rotation), etc.

Figure 3B:
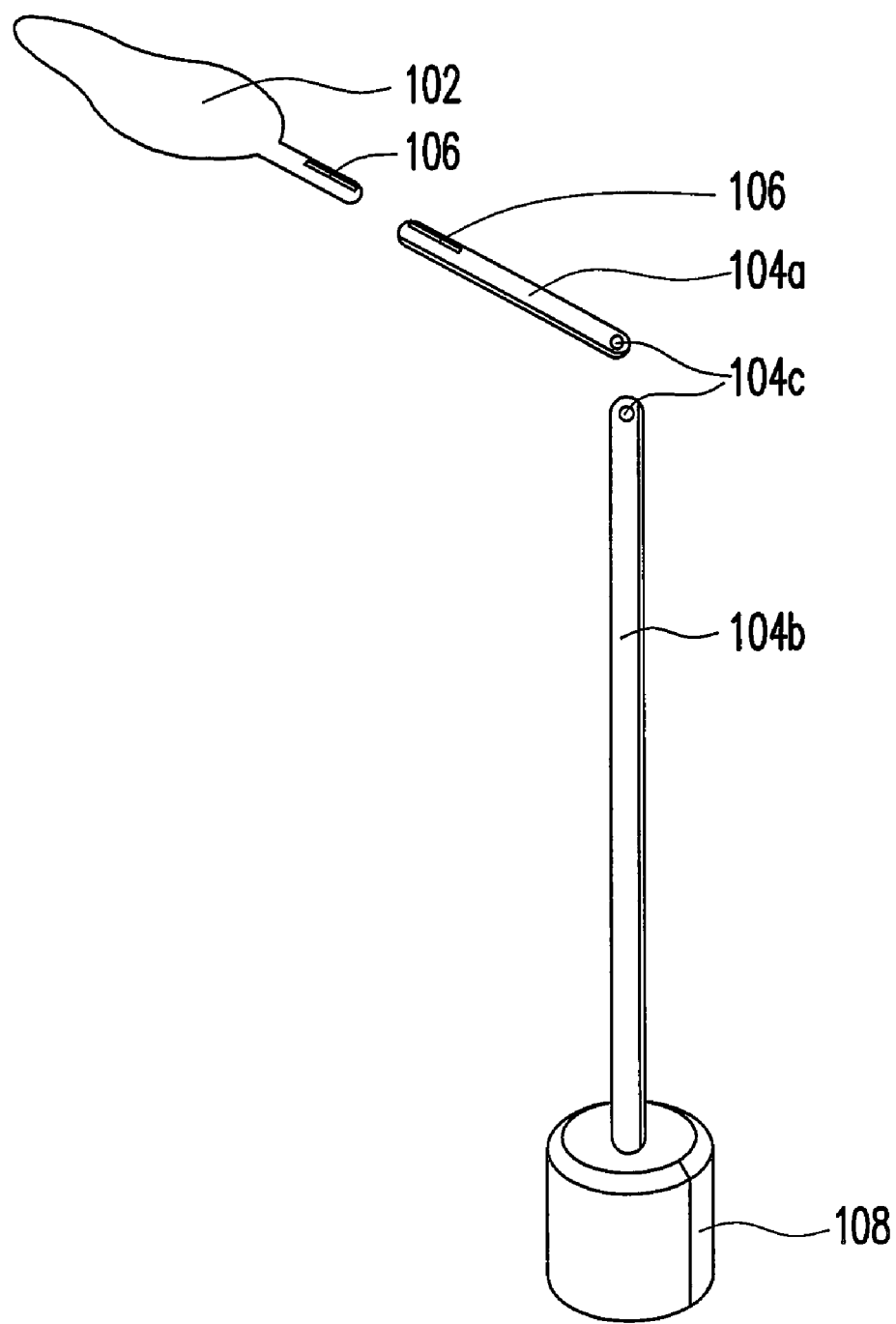
FIG. 3B is an explosion diagram of the structure shown in FIG. 3A.

FIG. 3B is an explosion diagram illustrating the structure of FIG. 3A. This diagram is only for describing that the foregoing movements in various directions are practically accomplishable; however the actual mechanism can be varied according to requirements as long as the shielding plate 102 can be eventually moved in various directions. As shown in FIG. 3B, the moving component 104 can comprise an extension transmission rod 104a and an erecting shaft 104b. The shielding plate 102 is slidably coupled to the extension transmission rod 104a, for example, through a groove (such as a sliding groove 106 in FIG. 3B) or an extension sleeve structure. In this way, the shielding plate 102 can be moved (slid) transversely along the X-axis. In addition, the erecting shaft 104b can be basically moved up and down along the Z-axis. The erecting shaft 104b can be coupled to the transmission rod 104a through a pivot component 104c so that the transmission rod 104a can be rotated around the Y-axis. In this manner, the shielding plate 102 can be tiltedly moved in relative to the evaporation source 10. A driving device 108 can control the erecting shaft 104b to move up and down and rotate and the transmission rod 104a to move. The moving component 104 can be properly controlled by a computer program based on different process conditions.

Based on the above various movements, the moving component 104 allows the shielding plate 102 to move, rotate, or tilt with respect to the evaporation source 10, so as to control the deposition amount of atoms on the substrate 20. During the vapor deposition process, the moving component 104 continuously moves the shielding plate 102 according to film deposition rates on the substrate, so as to compensate the deposited film thickness dynamically. In addition, using the shielding plate to operate more complicated composite movements can be achieved by using a commercially industrial robot arm with multi-directional operations according to precise calculations of computer programs.

Figure 1:
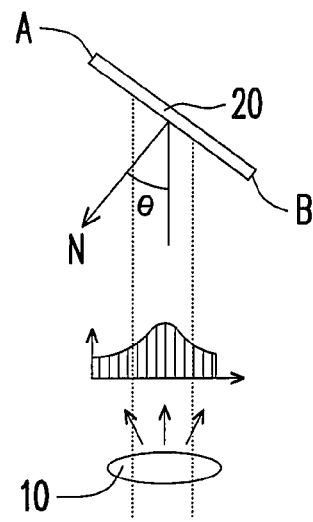
FIG. 1 is a diagram illustrating the film thickness distribution of conventional angle vapor deposition.

It can be understood from the conventional technology illustrated in FIG. 1 that since the substrate 20 is oblique to the evaporation source 10, differences in deposition film thickness will occur due to different deposition positions on the substrate 20 during a specific period. At the position on the substrate where is farther away from the evaporation source 10, the average thickness of the deposited film is thinner, while at the position on the substrate where is closer to the evaporation source 10, the average thickness of the deposited film thickness is thicker. Thus, in the present invention, the film thickness is compensated by moving the shielding plate 102. Accordingly, the solution is to deposit more atoms at the position of the substrate where is farther away from the evaporation source 10 and fewer atoms at the position of the substrate where is closer to the evaporation source 10, so as to balance the deposition amount of the atoms on different positions of the substrate 20 and to accomplish the compensation effect for the uniformity of film thickness. Accordingly, the foregoing concept is also used for controlling the movement of the shielding plate 102 by using the moving component 104.

Figure 4A:
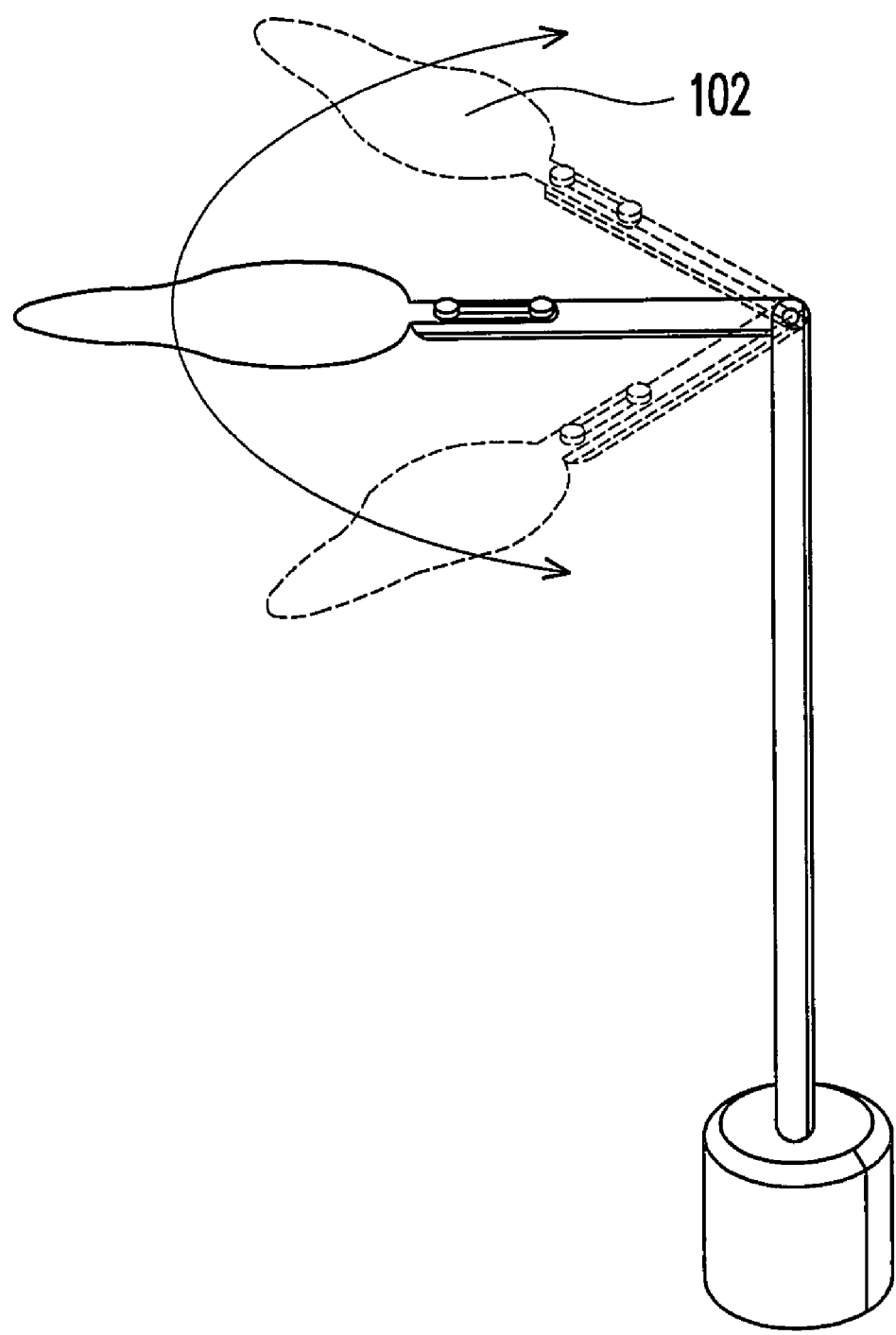
FIG. 4A is a schematic diagram illustrating the horizontal rotation and movement of the shielding plate.
Figure 4B:
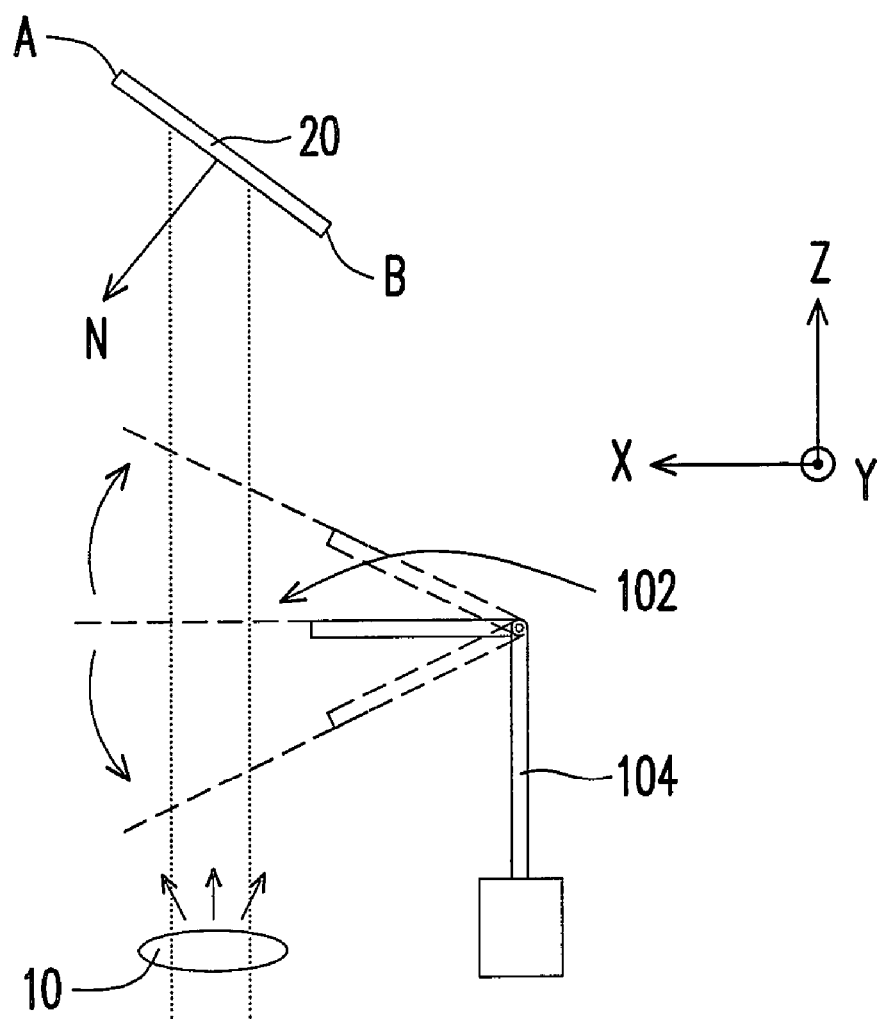
FIG. 4B is a schematic diagram illustrating the vertical rotation and movement of the shielding plate.

FIG. 4A is a diagram illustrating that the shielding plate is rotated horizontally. The deposition amount of atoms at different positions on the substrate 20 can be also controlled properly through a rotation movement in the horizontal direction. Due to the distance difference from the rotational center, the block range covering by the shielding plate 102 is also different. For example, since the position closer to the rotational center corresponds to block the near side B of the substrate 20, the blocked area is larger, so that the deposition amount of atoms is fewer. In contrast, since the position farther to the rotational center corresponds to blocking the far side A of the substrate 20, the blocked area is smaller, so that the deposition amount of atoms is more. Thus, non-uniformity of the film thickness can be compensated so as to make the deposited film thickness uniform eventually. In addition, FIG. 4B is a diagram illustrating that the shielding plate is rotated vertically (or tilted). The shielding plate in FIG. 4B is moved at a tilt angle with respect to the evaporation source 10, and the principle thereof is similar to the above case. The tilt angle can be set to an angle with respect to the substrate 20, or in parallel with the substrate 20. This tilt angle can be determined according to the actual requirement. Thus, according to the present invention, the compensation for the film thickness can be also achieved by rotating the shielding plate 102 horizontally or vertically.

Figure 5A:
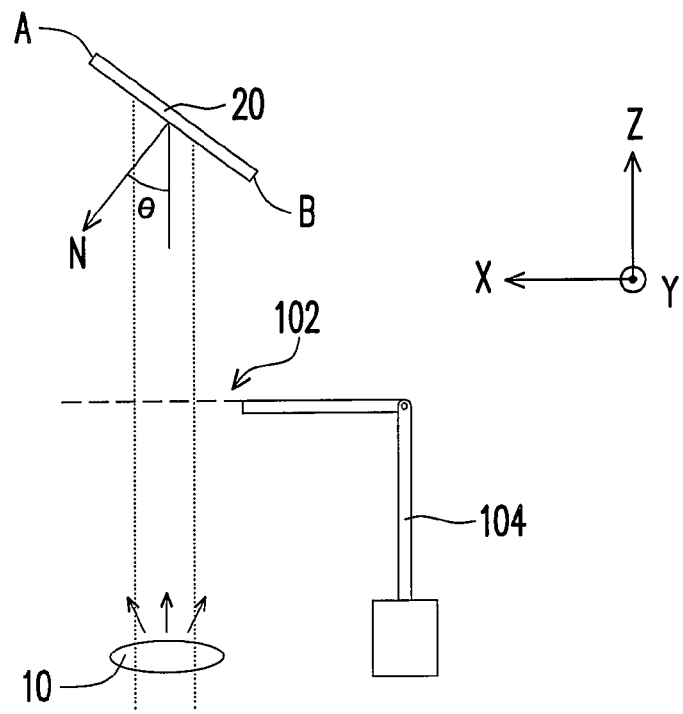
FIGS. 5A and 5B are diagrams illustrating a transverse movement for the shielding plate.
Figure 5B:
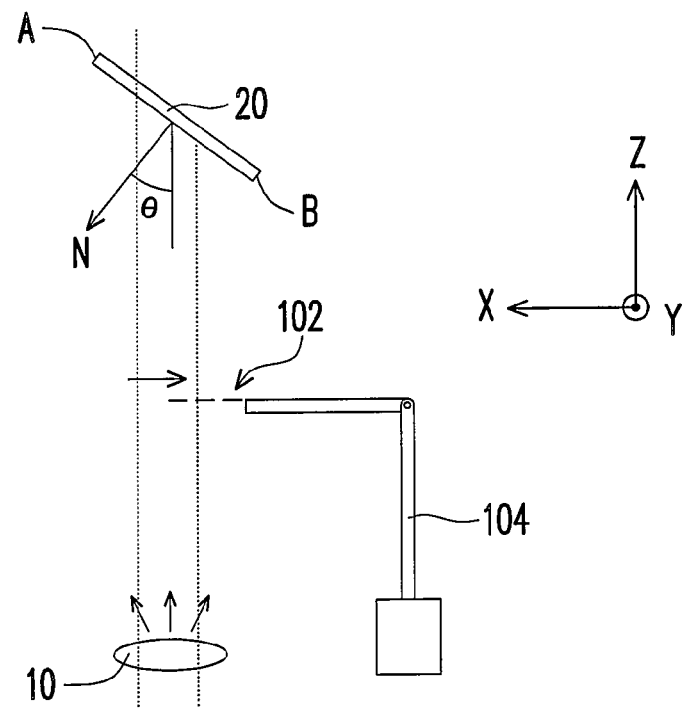

FIGS. 5A and 5B are diagrams illustrating that the shielding plate moves transversely. As shown in FIGS. 5A and 5B, the shielding plate 102 can move transversely along the X-axis. As shown in FIG. 3B, the shielding plate 102 can move in the X-axis direction by moving on the transmission rod 104a. At the beginning of the vapor deposition process, the shielding plate 102 covers the evaporation source 10. As the vapor deposition process is proceeded with time, the shielding plate 102 gradually moves transversely to the right side of the figure. As a result, the evaporation source 10 is gradually exposed, and thus atoms emitted from the evaporation source 10 are deposited onto the surface of the substrate 20. As described above, since the side A of the substrate 20 is farther away from the evaporation source 10, when the shielding plate 102 moves gradually to expose the source 10 so that atoms can be deposited onto the side A of the substrate 20, the deposition time corresponding to the above deposition position can be controlled to be longer. Namely, the moving speed of the shielding plate 102 at the side A of the substrate 200 is slower. Accordingly, the evaporation source 10 can deposit atoms with a sufficient amount at the side A of the substrate 20 to make the film thicker.

Next, when the shielding plate 102 is moved to expose the center or the near side B of the substrate 20, the film can be deposited to a certain thickness within a shorter time period since such deposition position is closer to the evaporation source 10. At this stage, the shielding plate 102 can be controlled to move faster during this period to finish the entire vapor deposition process quickly. Thus, a vapor deposition film with a uniform thickness can be formed on the substrate 20 through the above movement control of the shielding plate 102.

The transverse movement is described above for explaining the principle for controlling the uniformity of the film thickness. Moreover, an additional function of the transverse movement is to determine a preferable film deposition position to make the vapor deposition procedure smoother.

In addition, as described above, the shielding plate 102 has another moving direction. The shielding plate 102 can be moved up and down by the moving component 104. The distance between the shielding plate 102 and the evaporation source 10, that is, the distance between the shielding plate 102 and the substrate 20, can be adjusted through moving up and down the shielding plate 102, for example, moving up and down the erecting shaft 104b in FIG. 3B. The deposition amount of atoms at different positions of the substrate 20 can be controlled by lifting the shielding plate 102 up and down, so as to make film thickness uniform.

From the above description, the shielding plate 102 can be subject to the transverse movement along the X-axis, the horizontal rotation around the Z-axis (on the XY plane), the up and down lifting movement along the Z-axis, and the vertical rotation around the Y-axis by using the moving component 104. Through such controls, the shielding plate 102 can be moved continuously and dynamically according to film deposition positions on the substrate during the vapor deposition process, so as to control the deposited film thickness and to obtain a uniform film thickness.

Although the movements of the shielding plate are individually explained in the above descriptions, the movements and rotations in various directions can be combined according to the actual process conditions, so as to optimize the compensation for the film thickness.

Moreover, even though the foregoing description explains that the shielding plate is continuously moved during the vapor deposition process, however, at least one suspension period can be added during the process according to different conditions to temporally stop the shielding plate from moving or rotating for a certain period, for example, at a timing when changing moving angle or direction, or when moving at positions where the corresponding deposition rates have larger differences. The timing and duration for suspending the shielding plate can be determined according to the actual process.

The Second Embodiment

In foregoing embodiment, the film thickness is mainly compensated by moving the shielding plate 102, and the shape of the shielding plate 102 is not limited. In the present embodiment, the film thickness can be further compensated through the design of the shielding plate. According to the present invention, in addition to controlling the movement, rotation and speed of the shielding plate 102, a suitable shape design for the shielding plate 102 can further make conditions of the film thickness compensation better. FIGS. 6(a)-(f) are examples of various designs for the shielding plate according to the present invention. The shielding plate can be designed as a curve solid plate, a hollow solid plate, or a hollow mesh plate. Such designs of the shielding plate are based on the principle that more atoms can be deposited at the position of the substrate where is away from the evaporation source, and fewer atoms can be deposited at the position of the substrate where is close to the evaporation source.

The curve solid plate can be designed with a particular curve. For example, as shown in FIG. 6(a), one side of the curve solid plate is narrower and the other side is wider. The narrower side corresponds to the farther side A of the deposition positions on the substrate 20. Through such design, the amount of atoms passing through the shielding plate 102 to reach the substrate 20 can be compensated appropriately according to the deposition positions.

Based on the same principle, FIGS. 6(b)-6(e) illustrate designs of the hollow solid plate or mesh plate. For example as shown, the hollow solid plate can have a hollow pattern, and a density distribution thereof is designed according to the distance between the substrate 20 (the vapor deposition object) and the evaporation source 10. The design rule thereof is similar to that in the first embodiment; that is, the side A away from the evaporation source 10 has a sparse hollow pattern, and the side B closer to the evaporation source 10 has a dense hollow pattern. Similarly, the hollow mesh plate also has a hollow pattern, whose density distribution is also designed according to the distance between the substrate 20 (the vapor deposition object) and the evaporation source 10. In other words, the gaps formed corresponding to the deposition positions at the far side A of the substrate 20 are designed sparse so that more atoms can pass through, while the gaps formed corresponding to the deposition positions at the near side B of the substrate 20 are designed dense so that more atoms can be blocked from passing through the shielding plate 102, so as to reduce the deposition amount to the near side A of the substrate. Accordingly, the amount of the deposited atoms at different positions on the substrate 20 can be compensated, so as to make film thickness uniform.

Moreover, the shielding plate in FIG. 6(f) is a solid plate. The difference of the shielding plate in FIG. 6(f) to the curve solid plate in FIG. 6(a) is that the shielding plate in the present embodiment is not subject to a modification corresponding to the deposition distribution of the surface of the vapor deposition object. Although the shielding plate is not modified to a suitable shape, the film thickness can be still compensated appropriately by moving, rotating the shielding plate as described in the first embodiment.

The shielding plate shapes described above are only examples, and various variations can be made to the profile (the aforementioned particular curves), material, and hollow pattern of the shielding plate based on different process conditions.

Moreover, in a vapor deposition machine using the film thickness uniformity compensating apparatus 100, as shown in FIG. 2, an ion source 30 can be further included. The function of the ion source 30 is to carry out an ion bombard onto the surface of the substrate 20 so as to make the film deposited on the surface of the substrate 20 more uniform. The principle of the ion bombard will not be described herein.

The Third Embodiment

Figure 7:
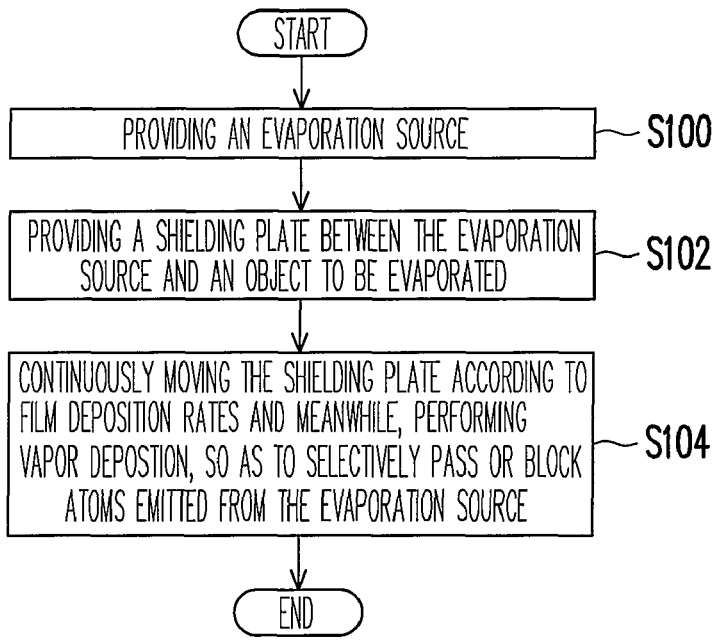
FIG. 7 is a flowchart illustrating a method for compensating a uniformity of a film thickness according to the present invention.

Next, a vapor deposition method corresponding to the aforementioned apparatus for depositing a film with a uniform thickness will be described. FIG. 7 is a flowchart illustrating the method for compensating the uniformity of the film thickness according to the present invention.

First, an evaporation source is provided in step S100. Generally, the vapor deposition object is placed into a vapor deposition machine which has an evaporation source for providing atoms that will be deposited on the surface of the vapor deposition object. The surface of the vapor deposition object is basically tilted by an angle with respect to the principal direction of atom emission of the evaporation source, for example, as shown in FIG. 2.

Figure 6:
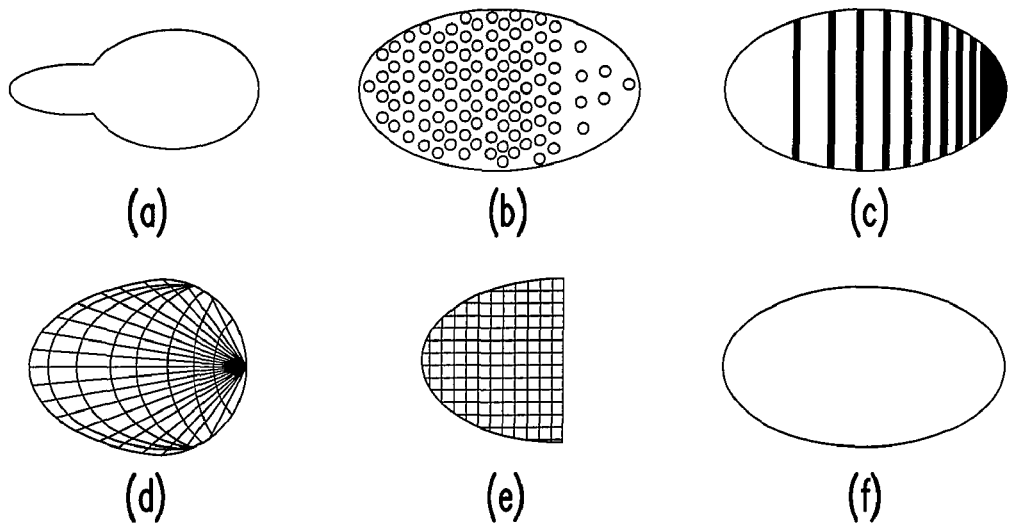
FIG. 6 illustrates various designs of the shielding plate according to the embodiment of the present invention.

Next, in step S102, a shielding plate is provided between the evaporation source and the vapor deposition object. The shape of the shielding plate can be any one as shown in FIG. 6 or other pattern not shown.

In step S104, a vapor deposition process is performed. During the vapor deposition process, the shielding plate is moved in a manner according to film deposition positions, so as to selectively pass or block atoms emitted from the evaporation source. The movement can be any one of the transverse movement along the X-axis, the horizontal rotation around the Z-axis (on the XY plane), the up-and-down lifting movement along the Z-axis and the vertical rotation around the Y-axis as shown in FIG. 3A, or any combination thereof.

In summary, according to the present invention, the shielding plate is moved between the evaporation source and the vapor deposition object during the vapor deposition process. The shielding plate can be moved continuously during the process or temporally suspended at least one specific period during the deposition process. The movement of the shielding plate can be the transverse movement, horizontal rotation, vertical rotation (tilting the shielding plate), and up-and-down lifting movement, etc. Therefore, the film thickness can be properly compensated by utilizing appropriated movements of the shielding plate, so as to make the vapor deposition film uniform.

Moreover, the film thickness can be further compensated by designing a suitable shape of the shielding plate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for compensating uniformity of a film thickness, comprising:
   a shielding plate, disposed between an evaporation source and a vapor deposition object, wherein the shielding plate is a solid plate and is capable of moving relatively to the evaporation source, the solid plate has a specific curve with a narrow side and a wide side formed according to a distance between the vapor deposition object and the evaporation source, the narrow side corresponds to a far side of film deposition positions on the vapor deposition object, and the wide side corresponds to a near side of the film deposition positions on the vapor deposition object; and
   a moving component, coupled to the wide side of the shielding plate, the moving component comprising:
   an extension transmission rod, coupled to the shielding plate for moving the shielding plate; and
   an erecting shaft, coupled to the extension transmission rod through a pivot component, capable of performing a rotation movement or an up-and-down lifting movement for the shielding plate;
   wherein during a vapor deposition process, the moving component moves the shielding plate according to film deposition rates, so as to selectively pass or block atoms emitted from the evaporation source, so that the deposition rates are adjusted to achieve an effect of obtaining a uniform film.

2. The apparatus as claimed in claim 1, wherein when the erecting shaft performs the rotation movement, the rotation movement comprises rotating the shielding plate horizontally to cover the evaporation source intermittently.

3. The apparatus as claimed in claim 1, wherein when the erecting shaft performs the rotation movement, the rotation movement comprises rotating the shielding plate vertically to adjust a tilt angle between the shielding plate and the vapor deposition object.

4. The apparatus as claimed in claim 1, wherein when the erecting shaft performs the up-and-down lifting movement, the up-and-down lifting movement of the shielding plate is performed in relative to the evaporation source and the vapor deposition object, so as to adjust a distance between the shielding plate and the evaporation source.

5. The apparatus as claimed in claim 1, wherein when the erecting shaft performs the rotation movement or the up-and-down lifting movement, the moving component controls the shielding plate to temporally stop in at least one suspension period during the vapor deposition process.

6. The apparatus as claimed in claim 1, wherein the shielding plate is a hollow solid plate having a hollow pattern and a density distribution of the hollow pattern formed according to a distance between the vapor deposition object and the evaporation source.

7. The apparatus as claimed in claim 1, wherein the shielding plate is a plate having a mesh pattern and a density distribution of the mesh pattern is formed according to a distance between the vapor deposition object and the evaporation source.

8. The apparatus as claimed in claim 1, wherein the moving component is a multi-directional robot arm for operating the shielding plate to move in a horizontal, a vertical and a rotational directions.

* * * * *